(12) United States Patent
Joo et al.

(10) Patent No.: US 10,868,092 B2
(45) Date of Patent: Dec. 15, 2020

(54) DISPLAY DEVICE HAVING DUMMY AND REFLECTIVE REGIONS

(71) Applicant: SAMSUNG DISPLAY CO., LTD., Yongin-si (KR)

(72) Inventors: Sun-Kyu Joo, Yongin-si (KR); In Seok Song, Yongin-si (KR); Keun Chan Oh, Yongin-si (KR); Byung-chul Kim, Yongin-si (KR); In Ok Kim, Yongin-si (KR); Gak Seok Lee, Yongin-si (KR); Chang-Soon Jang, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/215,942

(22) Filed: Dec. 11, 2018

(65) Prior Publication Data

US 2019/0280061 A1 Sep. 12, 2019

(51) Int. Cl.
*H01L 27/32* (2006.01)
*H01L 51/52* (2006.01)
*H01L 51/50* (2006.01)

(52) U.S. Cl.
CPC ........ *H01L 27/3246* (2013.01); *H01L 27/322* (2013.01); *H01L 27/3211* (2013.01); *H01L 27/3218* (2013.01); *H01L 27/3262* (2013.01); *H01L 51/5012* (2013.01); *H01L 51/5206* (2013.01); *H01L 51/5209* (2013.01); *H01L 51/5221* (2013.01); *H01L 51/5237* (2013.01); *H01L 27/3216* (2013.01); *H01L 27/3258* (2013.01); *H01L 51/5271* (2013.01)

(58) Field of Classification Search
CPC combination set(s) only.
See application file for complete search history.

(56) References Cited

U.S. PATENT DOCUMENTS

| | | | | |
|---|---|---|---|---|
| 2010/0045173 | A1* | 2/2010 | Kwon | H01L 27/3246 313/504 |
| 2012/0146030 | A1* | 6/2012 | You | H01L 27/124 257/59 |
| 2016/0155983 | A1* | 6/2016 | Lee | H01L 51/5209 257/40 |
| 2017/0053973 | A1* | 2/2017 | Park | H01L 27/3246 |
| 2017/0294614 | A1 | 10/2017 | Jia et al. | |
| 2018/0061907 | A1* | 3/2018 | Kim | H01L 27/322 |

FOREIGN PATENT DOCUMENTS

| | | |
|---|---|---|
| JP | 2016-173460 A | 9/2016 |
| KR | 10-2012-0127905 A | 11/2012 |
| KR | 10-2015-0127368 A | 11/2015 |

* cited by examiner

*Primary Examiner* — Nduka E Ojeh
(74) *Attorney, Agent, or Firm* — Kile Park Reed & Houtteman PLLC

(57) ABSTRACT

A display device includes a substrate, a thin film transistor on the substrate, an interlayer insulating layer on the thin film transistor, an electrode on the interlayer insulating layer, the electrode including an emission region, a contact region overlapping the thin film transistor, and a dummy region protruding from the emission region in a direction different from the contact region, and an emission layer on the electrode, the emission region of the electrode overlapping the emission layer.

23 Claims, 10 Drawing Sheets

DISPLAY DEVICE HAVING DUMMY AND REFLECTIVE REGIONS

CROSS-REFERENCE TO RELATED APPLICATION

Korean Patent Application No. 10-2018-0028279, filed on Mar. 9, 2018, in the Korean Intellectual Property Office, and entitled: "Display Device," is incorporated by reference herein in its entirety.

BACKGROUND

1. Field

The present disclosure relates to a display device.

2. Description of the Related Art

Recently, an organic light-emitting diode (OLED) display has attracted attention as a device for displaying an image. Since the OLED display has a self-emission characteristic and does not require an additional light source, unlike a liquid crystal display device, it is possible to reduce thickness and weight thereof. Further, the OLED display has high-quality characteristics, e.g., low power consumption, high luminance, and high response speed.

SUMMARY

An exemplary embodiment provides a display device including a substrate, a thin film transistor configured to be positioned on the substrate, an interlayer insulating layer configured to be positioned on the thin film transistor, an electrode configured to be positioned on the interlayer insulating layer, and an emission layer configured to be positioned on the electrode, wherein the electrode may include an emission region overlapping the emission layer, a contact region overlapping the thin film transistor, and a dummy region protruding from the emission region in a direction different from the contact region.

The dummy region and the contact region may be symmetrically disposed with respect to the emission region.

The interlayer insulating layer may include a first hole overlapping the contact region, and a groove overlapping the dummy region, while the contact region and the thin film transistor are connected through the first hole.

Thicknesses of the emission region, the contact region, and the dummy region may be substantially the same.

The display device may further include a pixel defining layer configured to be positioned on the electrode, wherein the emission layer may include a first emission layer that emits light having a first wavelength, a second emission layer that emits light having a second wavelength, and a third emission layer that emits light having a third wavelength, the pixel defining layer may include a first opening overlapping the first emission layer, a second opening overlapping the second emission layer, and a third opening overlapping the third emission layer, and the electrode may include a first electrode overlapping the first emission layer, a second electrode overlapping the second emission layer, and a third electrode overlapping the third emission layer.

The first electrode may include a first emission region, a first contact region, and a first dummy region, the second electrode may include a second emission region, a second contact region, and a second dummy region, and the third electrode may include a third emission region, a third contact region, and a third dummy region.

The first emission layer and the third emission layer, and the second emission layer, may be positioned at different sides with respect to an imaginary line connecting the first contact region, the second contact region, and the third contact region that are adjacent to each other.

At least one of the first dummy region, the second dummy region, and the third dummy region, and the remainder thereof, may be positioned at different sides with respect to an imaginary line connecting the first contact region, the second contact region, and the third contact region that are adjacent to each other.

The interlayer insulating layer may include a first interlayer insulating layer positioned on the thin film transistor, and a second interlayer insulating layer positioned on the first interlayer insulating layer.

The first hole may pass through the first interlayer insulating layer and the second interlayer insulating layer, and the groove may pass through the second interlayer insulating layer.

The contact region may contact the drain electrode through the first hole, and the dummy region may contact the first interlayer insulating layer through the groove.

The dummy region may be spaced apart from the emission region.

The display device may include a plurality of second electrodes, at least one of the plurality of second electrodes may include the contact region, the emission region, and the dummy region, and the remainder of the plurality of second electrodes may include the contact region and the emission region.

The electrode may include a reflective region.

The contact region, the dummy region, and the reflective region may be formed to be symmetrical with respect to the emission region.

The display device may include a common electrode positioned on the emission layer, a thin film encapsulation layer positioned on the common electrode, and at least one of a light blocking member and a color filter positioned on the thin film encapsulation layer.

Another embodiment provides a display device including a substrate, a thin film transistor configured to be positioned on the substrate, an interlayer insulating layer configured to be positioned on the thin film transistor, an electrode configured to be positioned on the interlayer insulating layer, and an emission layer configured to be positioned on the electrode, wherein the electrode may include an emission region overlapping the emission layer, a contact region overlapping the thin film transistor, and a dummy region protruding from the emission region, and the contact region and the dummy region are depressed from an upper surface of the interlayer insulating layer.

The dummy region and the contact region may be formed to protrude in different directions in a plan view with respect to the emission region.

A height of the depressed dummy region may be equal to or smaller than that of the depressed contact region.

Thicknesses of the emission region, the contact region, and the dummy region may be substantially the same.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
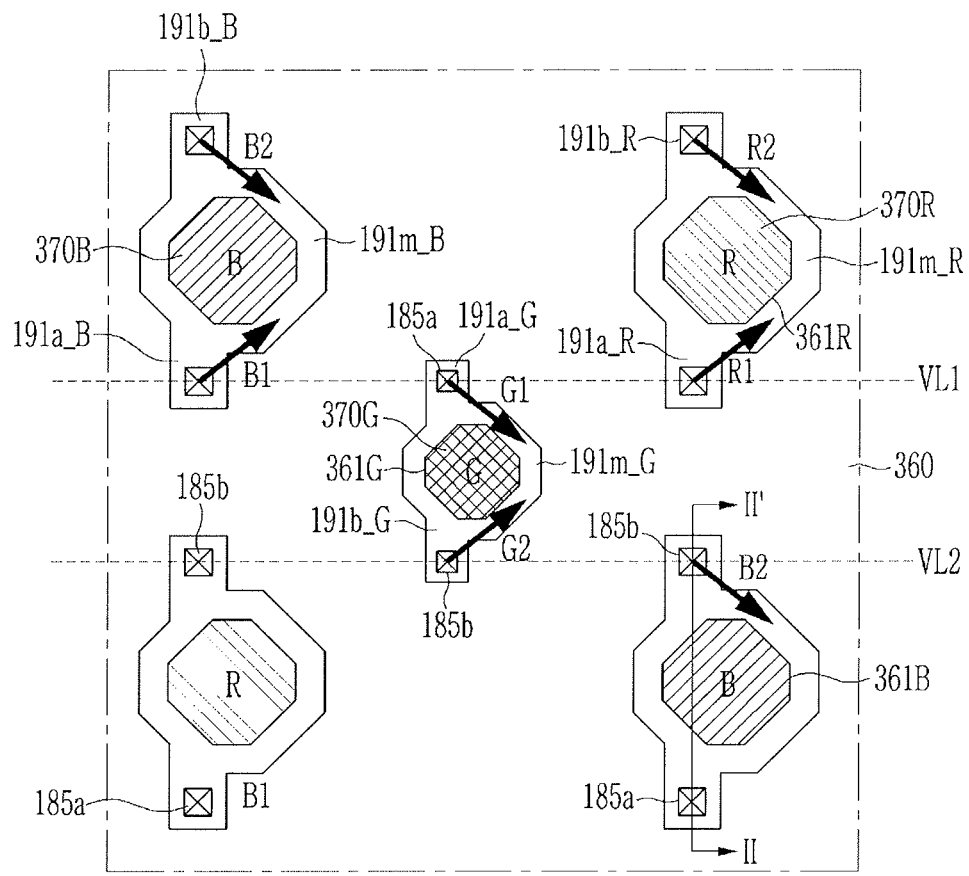
FIG. 1 illustrates a schematic top plan view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Further, in the specification, the word "on" or "above" means positioned on or below the object portion, and does not necessarily mean positioned on the upper side of the object portion based on a gravitational direction. In addition, unless explicitly described to the contrary, the word "comprise" and variations such as "comprises" or "comprising" will be understood to imply the inclusion of stated elements but not the exclusion of any other elements. Also, throughout the specification, the phrase "on a plane" means viewing a target portion from the top, and the phrase "on a cross-section" means viewing a cross-section formed by vertically cutting a target portion from the side.

Figure 2:
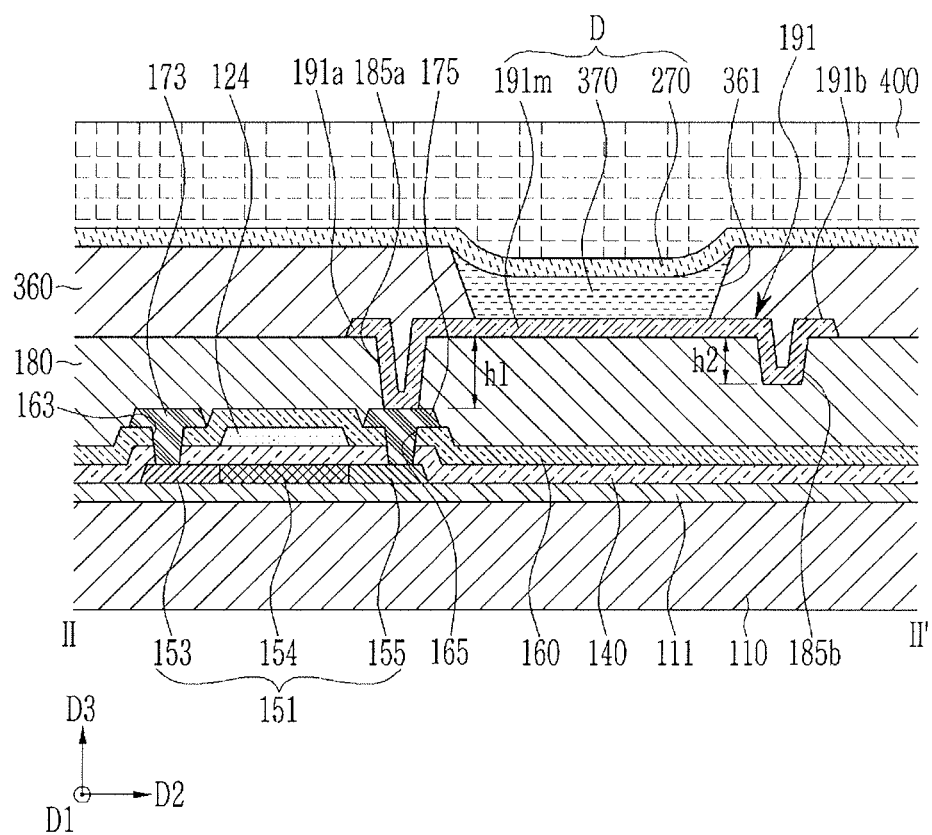
FIG. 2 illustrates a cross-sectional view taken along line II-II' of FIG. 1.

Hereinafter, a display device according to an exemplary embodiment will be described with reference to FIG. 1 and FIG. 2. FIG. 1 illustrates a schematic top plan view of a plurality of light-emitting elements included in a display device according to an exemplary embodiment, and FIG. 2 illustrates a cross-sectional view taken along line II-II' of FIG. 1.

Referring to FIG. 1, a display device according to an exemplary embodiment includes a first light-emitting element R, a second light-emitting element G, and a third light-emitting element B. The first light-emitting element R includes a first electrode 191R and a first emission layer 370R, the second light-emitting element G includes a second electrode 191G and a second emission layer 370G, and the third light-emitting element B includes a third electrode 191B and a third emission layer 370B.

The first electrode 191R includes a first emission region (191m_R), a first contact region (191a_R), and a first dummy region (191bR). The second electrode 191G includes a second emission region (191m_G), a second contact region (191a_G), and a second dummy region (191b_G). The third electrode 191B includes a third emission region (191m_B), a third contact region (191a_B), and a third dummy region (191b_B). In the specification, the emission region is referred to as a region overlapping the emission layer in one electrode, the contact region is referred to as a region substantially directly connected to another wire, electrode, or the like in one electrode, and the dummy region is referred to as a region that is not directly connected to another wire, electrode, or the like in one electrode and protrudes from the emission region. Details thereof will be described below.

As illustrated in FIG. 1, a contact region 191a and a dummy region 191b may protrude in different directions based on an emission region 191m in a plan view. For example, the first dummy region (191b_R) may protrude in a +D2 direction, and the first contact region (191a_R) may protrude in a −D2 direction. In addition, the second contact region (191a_G) may protrude in the +D2 direction, and the second dummy region (191b_G) may protrude in the −D2 direction. The third dummy region (191b_B) may protrude in the +D2 direction, and the third contact region (191a B) may protrude in the −D2 direction. Embodiments are not limited to the protruding directions, and the respective regions may protrude in any different direction.

As illustrated in FIG. 1, the contact region 191a and the dummy region 191b, e.g., in each of the first through third light-emitting elements R through B, may be disposed to be symmetrical based on the emission region 191m, e.g., in a top view. For example, the contact region 191a and the dummy region 191b, e.g., in each of the first through third light-emitting elements R through B, may be symmetrical based on an axis (X-axis) parallel to a D1 direction, e.g., the contact region 191a and the dummy region 191b may be symmetrical with respect to a symmetry axis crossing a center of a corresponding emission layer 370 along the direction D1 from a top view. However, the symmetrical disposition is not limited thereto.

A first pair of the first emission layer 370R and third emission layer 370B, and the second emission layer 370b, may be positioned at different sides with respect to an imaginary first line VL1 that connects the first contact region (191a_R), the second contact region (191a_G), and the third contact region (191a_B) according to the exemplary embodiment. For example, the first pair of the first emission layer 370R and the third emission layer 370B may be positioned in the +D2 direction relative to the imaginary first line VL1, and the second emission layer 370G may be positioned in the −D2 direction relative to the imaginary first line VL1. The imaginary first line VL1 may extend in the D1 direction.

In addition, a second pair of the first emission layer 370R and third emission layer 370B, and the second emission layer 370G, may be positioned at different sides with respect to an imaginary second line VL2 that connects the first dummy region (191b_R), the second dummy region (191b_G), and the third dummy region (191b_B). For example, the second pair of the first emission layer 370R and the third emission layer 370B may be positioned in the −D2 direction relative to the imaginary second line VL2, and the second emission layer 370G may be positioned in the +D2 direction relative to the imaginary second line VL2. The imaginary second line VL2 may extend in the D1 direction. For example, as illustrated in FIG. 1, the second emission layer 370G may be in a center between the first and second pairs of the first emission layer 370R and third emission layer 370B.

At least one of the first dummy region (191b_R), the second dummy region (191b_G), and the third dummy region (191b_B) may be positioned at another side based on the imaginary first line VL1 that connects the first contact region (191a_R), the second contact region (191a_G), and the third contact region (191a_B) according to the exemplary embodiment. In the imaginary first line VL1 formed by the first light-emitting element R, the second light-emitting element G, and the third light-emitting element B, the first dummy region (191b_R) of the first light-emitting element R and the third dummy region (191b_B) of the third light-emitting element B, and the second dummy region (191b_G) of the second light-emitting element G, may be positioned at different sides based on the imaginary first line VL1. That is, the first dummy region (191b_R) of the first light-emitting element R and the third dummy region (191b_B) of the third light-emitting element B may be positioned in the +D2 direction based on the imaginary first line VL1, and the second dummy region (191b_G) of the second light-emitting element G may be positioned in the −D2 direction based on the imaginary first line VL1.

Alternatively, at least one of the first contact region (191a_R), the second contact region (191a_G), and the third contact region (191a_B) may be positioned at another side based on the imaginary second line VL2 that connects the first dummy region (191b_R), the second dummy region (191b_G), and the third dummy region (191b_B). In the imaginary second line VL2 formed by the first light-emitting element R, the second light-emitting element G, and the third light-emitting element B, the first contact region (191a_R) of the first light-emitting element R and the third contact region (191a_B) of the third light-emitting element B, and the second contact region (191a G) of the second light-emitting element G, may be positioned at different sides based on the imaginary second line VL2. That is, the first contact region (191a_R) of the first light-emitting element R and the third contact region (191a_B) of the third light-emitting element B may be positioned in the −D2 direction based on the imaginary second line VL2. The second contact region (191a_G) of the second light-emitting element G may be positioned in the +D2 direction based on the imaginary second line VL2.

In a comparative electrode, i.e., which does not include a dummy region, purple light may be emitted in a 1 o'clock direction while first red light R1 reflected by the first contact region (191a_R) and first blue light B1 reflected by the third contact region (191a_B) is summed. In addition, in the second contact region (191a_G), first green light G1 may be reflected in a 5 o'clock direction, thus emitting green light. Therefore, purple light may be viewed in some regions and green light may be viewed in other regions, which is referred to as a reflected color separation phenomena.

In contrast, in the display device according to the exemplary embodiment, since dummy regions are formed on the pixel electrode 191 opposite the contact regions, white light may be emitted while the first red light R1 reflected by the first contact region (191a_R), the second green light G2 reflected by the second dummy region (191b_G), and the first blue light B1 reflected by the third contact region are summed (i.e., the three arrows pointing up in FIG. 1). In addition, white light may be emitted while the second red light R2 reflected by the first dummy region (191b_R), the first green light G1 reflected by the second contact region (191a_G), and the second blue light B2 reflected by the third dummy region (191b_B) are summed (i.e., the arrows pointing down in FIG. 1). Even though reflection occurs by a surface light source or point light source in a state in which a display device is not driven, it is possible to reduce a reflected color separation phenomenon and to emit white light through a dummy region and a contact region that are symmetrically disposed.

Hereinafter, a stacked structure of a display device according to an exemplary embodiment will be specifically described with reference to FIG. 2 together with FIG. 1. It is noted that the structure of the pixel electrode in FIG. 2 may be applicable to either of the first through third electrodes 191R through 191B in FIG. 1.

Referring to FIG. 2, a buffer layer 111 may be positioned on a substrate 110. The substrate 110 may be an insulating substrate including, e.g., glass, polymer, stainless steel, or the like. The substrate 110 may be flexible, stretchable, foldable, bendable, or rollable. Since the substrate 110 is flexible, stretchable, foldable, bendable, or rollable, the display device may be wholly flexible, stretchable, foldable, bendable, or rollable.

The buffer layer 111 may overlap a front surface of the substrate 110. The buffer layer 111 may include an inorganic material, e.g., a silicon oxide ($SiO_x$), a silicon nitride ($SiN_x$), and the like. The buffer layer 111 may have a single layer structure or a multiple layer structure.

The buffer layer 111 may flatten one surface of the substrate 110, or may prevent diffusion of impurities and penetration of moisture or the like that degrades characteristics of a semiconductor layer 151, which will be described later. In some exemplary embodiments, the buffer layer 111 may be omitted.

The semiconductor layer 151 may be positioned on the buffer layer 111. The semiconductor layer 151 may include a channel region 154 and a source region 153 and a drain region 155 that are doped, and are on opposite side of the channel region 154. The semiconductor layer 151 may include, e.g., polysilicon, amorphous silicon, or an oxide semiconductor.

A gate insulating layer 140 may be positioned on the semiconductor layer 151. The gate insulating layer 140 may be positioned to overlap a front surface of the substrate 110. The gate insulating layer 140 may include an inorganic insulating material, e.g., a silicon oxide ($SiO_x$), a silicon nitride ($SiN_x$), and the like.

A gate conductor including a gate electrode 124 of a thin film transistor may be positioned on the gate insulating layer 140. The gate electrode 124 may overlap the channel region 154 of the semiconductor layer 151.

An insulating layer 160 including an inorganic insulating material or an organic insulating material may be positioned on the gate electrode 124. Data conductors including a source electrode 173 and a drain electrode 175 of the thin film transistor, and a data line, a signal line, and the like may be positioned on the insulating layer 160. The source electrode 173 and the drain electrode 175 may be respectively connected to the source region 153 and the drain region 155 of the semiconductor layer 151 through contact holes 163 and 165 provided in the insulating layer 160 and the gate insulating layer 140.

The gate electrode 124, the source electrode 173, and the drain electrode 175 form a thin film transistor together with the semiconductor layer 151. The shown thin film transistor may be a thin film transistor included in one pixel of the organic light-emitting diode display. The shown thin film transistor may be referred to as a top-gate transistor since the gate electrode 124 is positioned above the semiconductor layer 151. However, a structure of the transistor is not limited thereto, and may be variously modified. For example, the transistor may be a bottom-gate transistor of which a gate electrode is positioned below a semiconductor layer.

An interlayer insulating layer 180 may be positioned on the insulating layer 160 and the data conductors. The interlayer insulating layer 180 may serve to remove and flatten a step and to improve light-emitting efficiency of a light-emitting element to be formed thereon. The interlayer insulating layer 180 may overlap and cover the thin film transistor.

The interlayer insulating layer 180 may include, e.g., an organic insulating material. The organic insulating material may include, e.g., polyimide, polyamide, polyacrylate, polyphenylene ether, polyphenylene sulfide, unsaturated polyester, an epoxy resin, a phenolic resin, and the like, but is not limited thereto.

The interlayer insulating layer 180 is provided with a first hole 185a overlapping the contact region 191a and a groove 185b overlapping the dummy region 191b. A height h1 of the first hole 185a and a height h2 of the groove 185b along the third direction D3 may be different from each other. For example, the height 111 of the first hole 185a may be greater than twice the height h2 of the groove 185b.

An electrode 191 is positioned on the interlayer insulating layer 180. The pixel electrode 191 may include the emission region 191m overlapping an emission layer 370, the contact region 191a overlapping the first hole 185a, and the dummy region 191b overlapping the groove 185b. The electrode 191 may be a pixel electrode, and may be connected to the drain electrode 175 of the thin film transistor through the contact region 191a and the first hole 185a provided in the interlayer insulating layer 180.

The pixel electrode 191 may include a reflective conductive material, a transflective conductive material, or a transparent conductive material. For example, the entirety of the pixel electrode 191, i.e., the emission region 191m, the contact region 191a, and the dummy region 191b may all include a same material. For example, the pixel electrode 191 may include one of a transparent conductive material, e.g., an indium tin oxide (ITO) and an indium zinc oxide (IZO), and a metal, e.g., lithium (Li), calcium (Ca), aluminum (Al), silver (Ag), magnesium (Mg), and gold (Au).

For example, the emission region 191m, the contact region 191a, and the dummy region 191b of the pixel electrode 191 may be continuous and integral with each other. For example, as was discussed previously and as illustrated in FIG. 2, the contact region 191a and the dummy region 191b may be at opposite sides of the emission region 191m along the second direction D2. Thicknesses of the emission region 191m, the contact region 191a, and the dummy region 191b in the pixel electrode 191 may be substantially the same. The contact region 191a and the dummy region 191b may have the same thickness even in a region overlapping the contact hole.

The contact region 191a and the dummy region 191b may have a depressed shape with respect to an upper surface of the interlayer insulating layer 180. The contact region 191a may have a depressed shape in a region overlapping the first hole 185a, i.e., to electrically contact the thin film transistor. The dummy region 191b may have a depressed shape in a region overlapping the groove 185b, e.g., the dummy region 191b may only partially extend into the interlayer insulating layer 180 without contacting a bottom surface of the interlayer insulating layer 180.

In detail, the height h1 at which the contact region 191a is depressed and the height h2 at which the dummy region 191b is depressed, may be different. The height h1 at which the contact region 191a is depressed may be greater than, e.g., about twice, the height h2 at which the dummy region 191b is depressed.

As described above, the pixel electrode 191 according to the exemplary embodiment may include the first electrode 191R overlapping the first emission layer 370R, the second electrode 191G overlapping the second emission layer 370G, and the third electrode 191B overlapping the third emission layer 370B. Each of the first electrode 191R, the second electrode 191G, and the third electrode 191B may include the emission region, the contact region, and the dummy region that are described above with respect to FIG. 2. Since this configuration has been described with reference to FIG. 1, it will be omitted below.

A pixel defining layer 360 may be positioned on the interlayer insulating layer 180 and the pixel electrode 191. The pixel defining layer 360 may overlap some of the pixel electrode 191.

The pixel defining layer 360 is provided with an opening 361 overlapping the pixel electrode 191, e.g., overlapping the emission region 191m of the pixel electrode 191. The opening 361 of the pixel defining layer 360 may define a region corresponding to a pixel. The opening 361 may include a first opening 361R overlapping the first emission layer 370R, a second opening 361G overlapping the second emission layer 370G, and a third opening 361B overlapping the third emission layer 370B.

The opening 361 may have, e.g., a polygonal shape or a circular shape, in a plan view, and the polygonal shape may include, e.g., a quadrangular shape, a triangular shape, a pentagonal shape, a hexagonal shape, a heptagonal shape, and an octagonal shape. Even if the opening 361 has a polygonal shape, it may have a polygonal shape close to a circular shape according to a process. The pixel defining layer 360 may include an organic insulating material, e.g., polyimide, polyacrylate, and polyamide, but is not limited thereto.

The emission layer 370 is positioned on the pixel electrode 191. The emission layer 370 includes an emission region. The emission layer 370 may additionally include at least one of a hole injection region, a hole transport region, an electron injection region, and an electron transport region.

The emission layer 370 may include a material for intrinsically displaying light of primary colors, e.g., red, green, and blue. The emission layer 370 may include the first emission layer 370R for emitting light having a first wavelength, the second emission layer 370G for emitting light having a second wavelength, and the third emission layer 370B for emitting light having a third wavelength. For example, the light having the first wavelength may be red, the light having the second wavelength may be green, and the light having the third wavelength may be blue.

In addition, a structure in which a plurality of organic material layers for emitting light of different colors are stacked may be provided. Moreover, an inorganic material for emitting light, e.g., red, green, and blue light, may be included therein.

A common electrode 270 for transmitting a common voltage is positioned on the emission layer 370. The common electrode 270 may include a transparent conductive material, e.g., an indium tin oxide (ITO) and an indium zinc oxide (IZO). The common electrode 270 may be formed to have light transmittance by thinly stacking a metal, e.g., calcium (Ca), barium (Ba), magnesium (Mg), aluminum (Al), or the like. At least one passivation layer or functional layer may be formed on the common electrode 270.

The pixel electrode 191, the emission layer 370, and the common electrode 270 form a light-emitting device D which is a light-emitting diode (LED). For example, the pixel electrode 191 may be an anode which is a hole injection electrode, and the common electrode 270 may be a cathode which is an electron injection electrode. In another example, the pixel electrode 191 may be the cathode, and the common electrode 270 may be the anode. Holes and electrons are injected into the emission layer 370 from the pixel electrode 191 and the common electrode 270, respectively, and exitons in which the injected holes and electrons are combined enter a ground state from an excited state to emit light.

A thin film encapsulation layer 400 may be positioned on the common electrode 270. The thin film encapsulation layer 400 may include a plurality of inorganic or organic layers, or may have a structure in which the inorganic layers and the organic layers are alternately stacked.

The inorganic layer may include a metal oxide or a metal nitride. For example, the inorganic layer may include one of $SiN_x$, $Al_2O_3$, $SiO_2$, and $TiO_2$. The organic layer may include a polymer, and may include, e.g., one of polyethylene terephthalate, polyimide, polycarbonate, epoxy, polyethylene, and polyacrylate.

In the present specification, the exemplary embodiment in which the thin film encapsulation layer 400 is positioned directly on the common electrode 270 is illustrated, but embodiments are not limited thereto. For example, ac separate filling material, an adhesive material, or the like may be positioned between the common electrode 270 and the thin film encapsulation layer 400.

Figure 3:
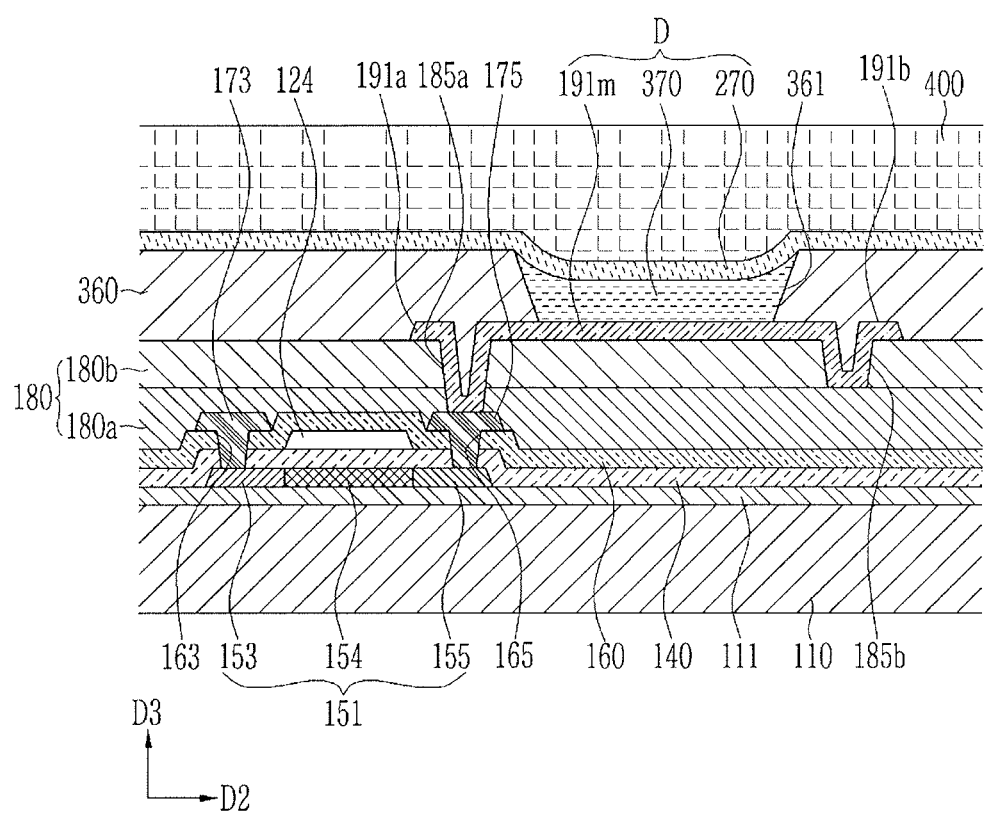
FIG. 3 illustrates a cross-sectional view of one pixel according to an exemplary embodiment.
Figure 4:
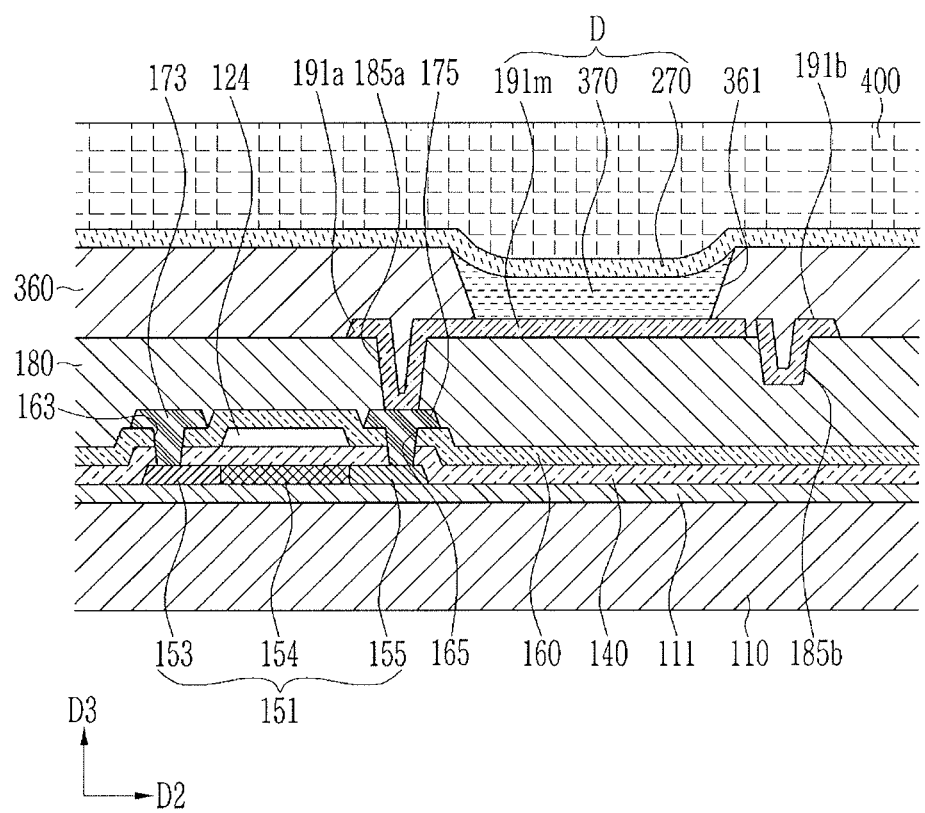
FIG. 4 illustrates a cross-sectional view of one pixel according to an exemplary embodiment.
Figure 5:
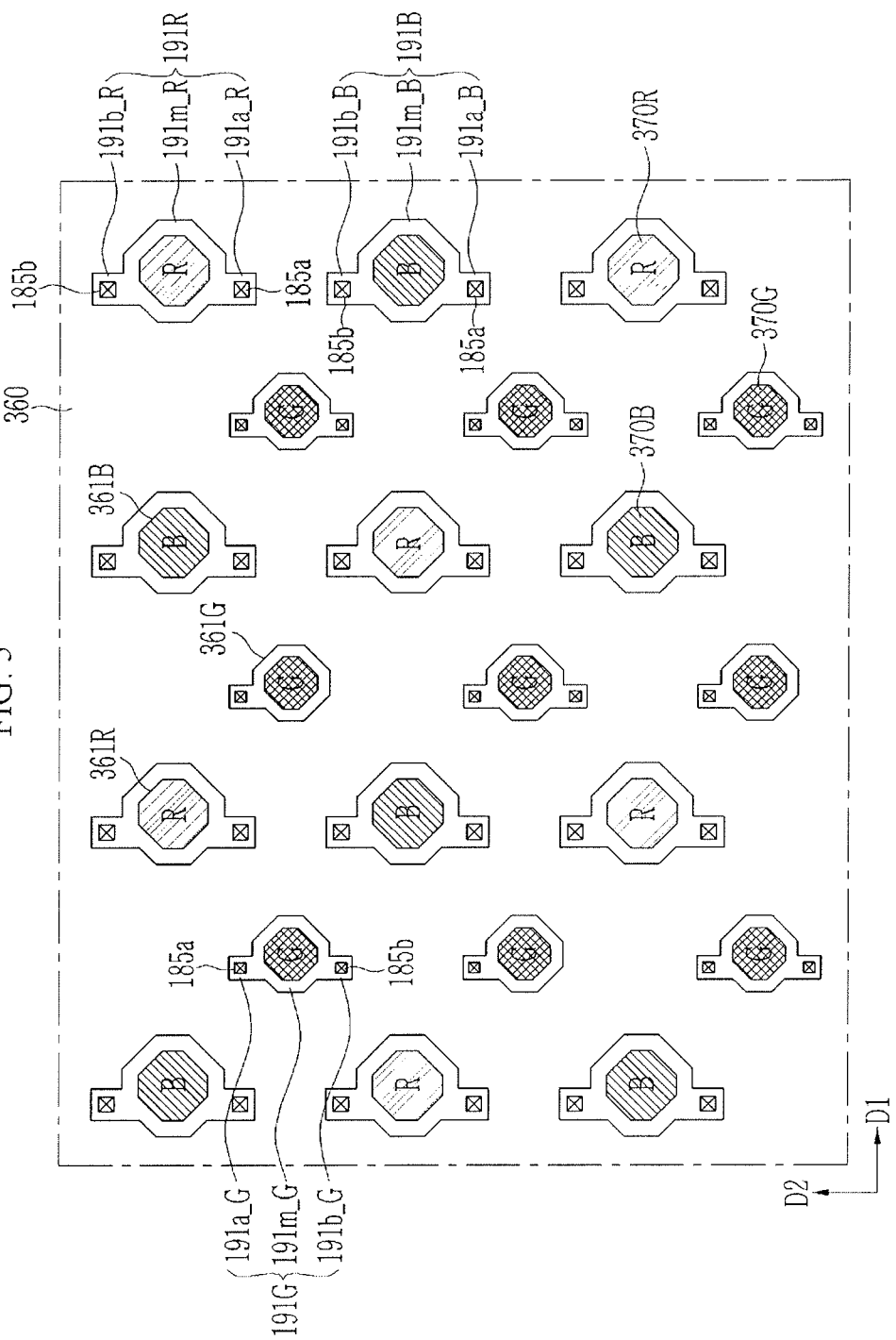
FIG. 5 illustrates a schematic top plan view of a display device according to an exemplary embodiment.

Hereinafter, a display device according to an exemplary embodiment will be described with reference to FIG. 3 to FIG. 5. FIG. 3 illustrates a cross-sectional view of one pixel according to an exemplary embodiment, FIG. 4 illustrates a cross-sectional view of one pixel according to an exemplary embodiment, and FIG. 5 illustrates a schematic top plan view of a display device according to an exemplary embodiment. Descriptions for constituent elements that are identical or similar to those of the exemplary embodiments described above with reference to FIG. 1 and FIG. 2 will be omitted.

Referring to FIG. 3, the interlayer insulating layer 180 according to the exemplary embodiment includes a first interlayer insulating layer 180a and a second interlayer insulating layer 180b. The first interlayer insulating layer 180a may be positioned on the thin film transistor, e.g., on the source electrode 173 and the drain electrode 175. The second interlayer insulating layer 180b may be positioned on the first interlayer insulating layer 180a. The first interlayer insulating layer 180a and the second interlayer insulating layer 180b may contain the same material or may contain different materials.

The first hole 185a may pass through the first interlayer insulating layer 180a and the second interlayer insulating layer 180b. The groove 185b may pass through the second interlayer insulating layer 180b, e.g., the groove 185b may not extend into the first interlayer insulating layer 180a. The contact region 191a may be connected to the thin film transistor through the first hole 185a, and the dummy region 191b may contact the first interlayer insulating layer 180a through the groove 185b.

Referring to FIG. 4, the emission region 191m and the dummy region 191b according to the exemplary embodiment may be spaced apart from each other, e.g., a portion of the pixel defining layer 360 may separate the emission region 191m and the dummy region 191b. The emission region 191m and the dummy region 191b may not be connected, and no voltage may be separately applied to the dummy region 191b. No voltage is separately applied to the dummy region 191b, thereby preventing capacitance from being unnecessarily formed between the dummy region 191b and another signal line or electrode.

Referring to FIG. 5, a display device according to an exemplary embodiment includes the first light-emitting element R, the second light-emitting element G, and the third light-emitting element B. The first electrode 191R includes the first emission region (191m_R), the first contact region (191a_R), and the first dummy region (191b_R). The third electrode 191B includes the third emission region (191m_B), the third contact region (191a_B), and the third dummy region (191b_B).

Some of a plurality of the second electrodes 191G according to the exemplary embodiment include the second emission region (191m_G), the second contact region (191a_G), and the second dummy region (191b_G). In addition, the remainder of the plurality of the second electrodes 191G include the second emission region (191m_G) and the second contact region (191a_G), e.g., some of the plurality of second electrodes 191G according to the exemplary embodiment may not include the second dummy region (191b_G).

As shown in FIG. 5, in the display device according to an exemplary embodiment, the numbers of the first light-emitting elements R, the second light-emitting elements G. and the third light-emitting elements B per unit area may be different. The number of the second light-emitting elements G per unit area may be larger than that of the first light-emitting elements R per unit area, and the number of the second light-emitting elements G per unit area may be larger than that of the third light-emitting elements B per unit area. When all of the plurality of second electrodes 191G include the dummy region 191b, a reflection degree of green light may be greater than that of red or blue light. Therefore, as illustrated in FIG. 5, some of the second electrodes 191G according to the exemplary embodiment may not include the dummy region (191b G).

Figure 6:
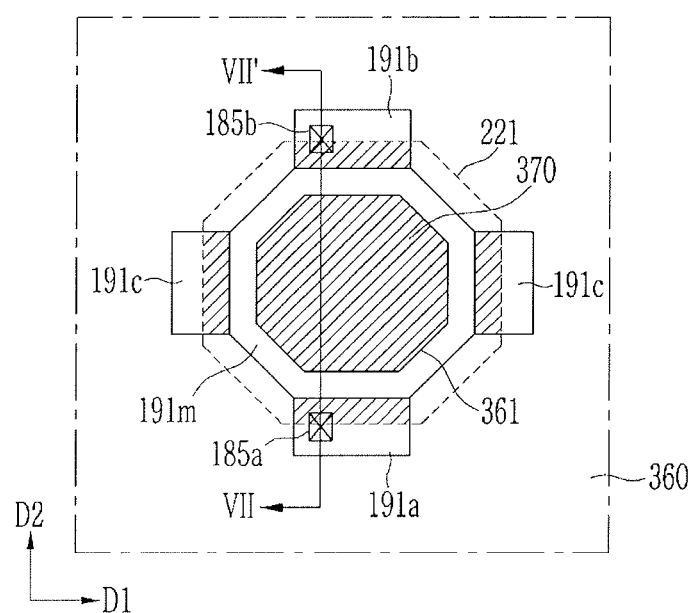
FIG. 6 illustrates a schematic top plan view of one pixel according to an exemplary embodiment.

Hereinafter, a display device according to an exemplary embodiment will be described with reference to FIG. 6 to FIG. 8. FIG. 6 illustrates a schematic top plan view of one pixel according to an exemplary embodiment, FIG. 7 illustrates a cross-sectional view taken along line VII-VII' of FIG. 6, and FIG. 8 illustrates a cross-sectional view of one pixel according to an exemplary embodiment.

Figure 7:
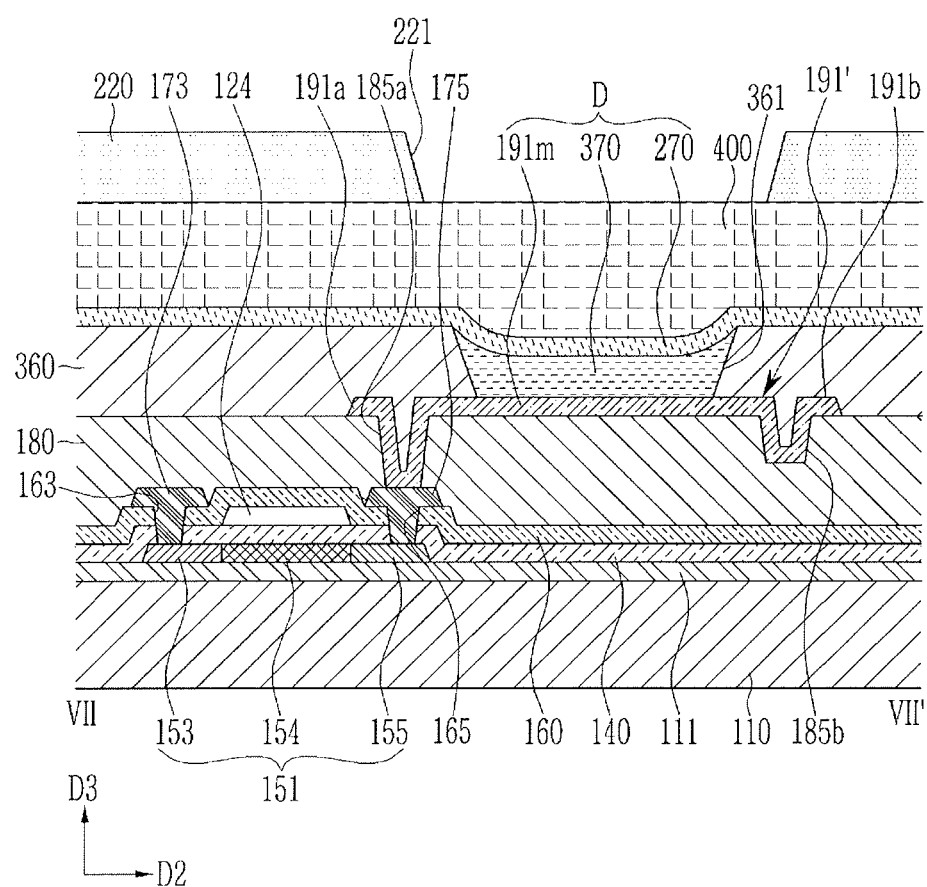
FIG. 7 illustrates a cross-sectional view taken along line VII-VII' of FIG. 6.
Figure 8:
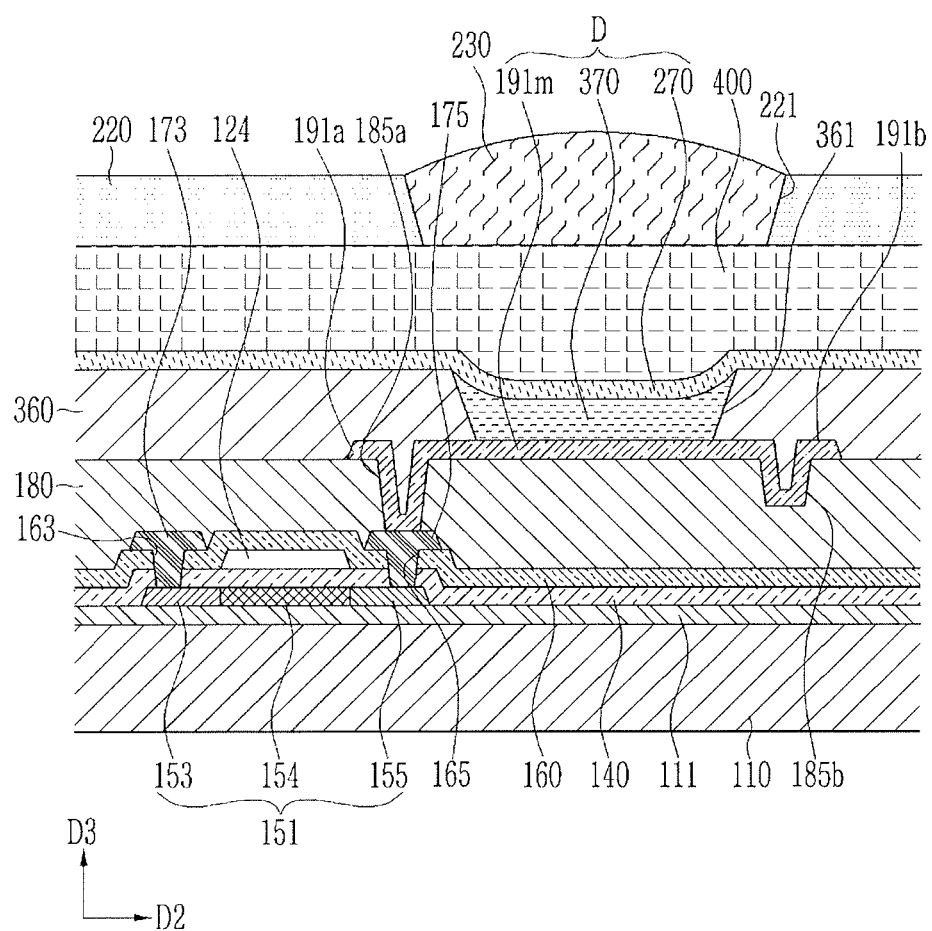
FIG. 8 illustrates a cross-sectional view of one pixel according to an exemplary embodiment.

Referring to FIG. 6 and FIG. 7, a light blocking member 220 may be positioned on the thin film encapsulation layer 400. The light blocking member 220 according to the exemplary embodiment may be positioned to overlap part of the pixel electrode 191. In addition, the light blocking member 220 may overlap part of the pixel defining layer 360. An area of an opening 221 of the light blocking member 220 may be larger than that of the opening 361 of the pixel defining layer 360.

A pixel electrode 191' according to the exemplary embodiment may include the emission region 191m, the contact region 191a, the dummy region 191b, and a reflective region 191c. The contact region 191a, the dummy region 191b, and the reflective region 191c may be symmetrical with respect to the emission region 191m.

The contact region 191a, the dummy region 191b, and the reflective region 191c that do not overlap the light blocking member 220 may be symmetrical with respect to the emission region 191m. The reflective regions 191c not overlapping the light blocking member 220 may be symmetrical with respect to the D2 direction, and the contact region 191a and the dummy region 191b may be symmetrical with respect to the D1 direction. Light reflected by the contact region 191a, the dummy region 191b, and the reflective region 191c is not reflected to be biased in one direction, so that the reflected color separation phenomenon may be reduced.

In the present specification, the contact region 191a, the dummy region 191b, and the reflective region 191c are symmetrically illustrated, but embodiments are not limited thereto. For example, the contact region 191a, and any structure in which areas of the dummy region 191b and the reflective region 191c that do not overlap the light blocking member 220 are substantially the same is possible.

Referring to FIG. 8, a display device according to an exemplary embodiment may include the light blocking member 220 and a color filter 230 that are positioned on the thin film encapsulation layer 400. The light blocking member 220 may overlap the pixel defining layer 360, and the color filter 230 may overlap the emission layer 370.

The color filter 230 may include a resin composition displaying the same color as the light emitted from the emission layer 370. For example, when red light is emitted from the emission layer 370, the color filter 230 may be a red color filter, when green light is emitted from the emission layer 370, the color filter 230 may be a green color filter, and when blue light is emitted from the emission layer 370, the color filter 230 may be a blue color filter.

Figure 9:
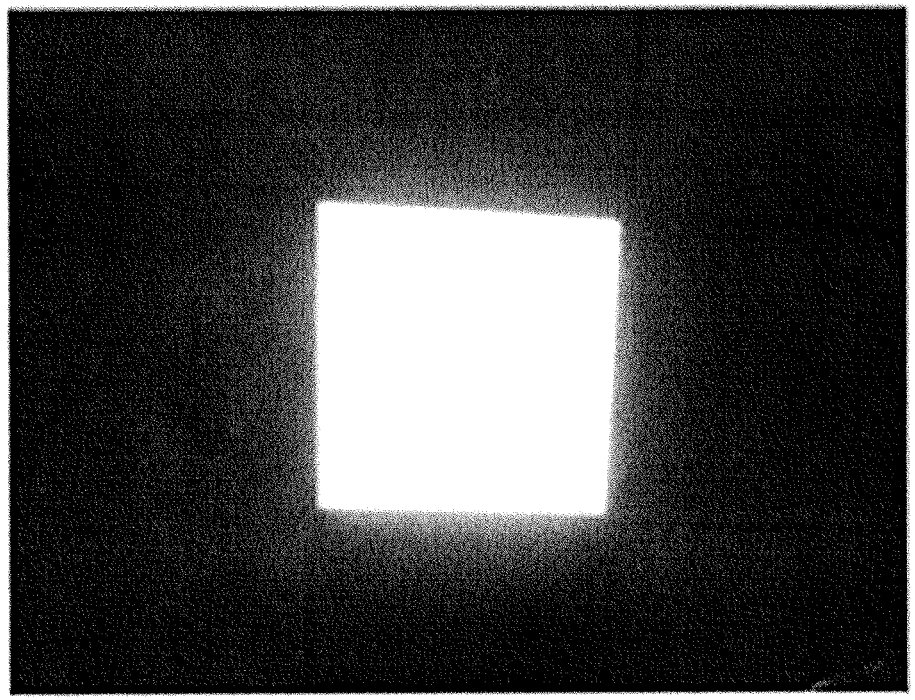
FIG. 9 illustrates an image observed when light of a surface light source is reflected on a display device according to an exemplary embodiment.
Figure 10:
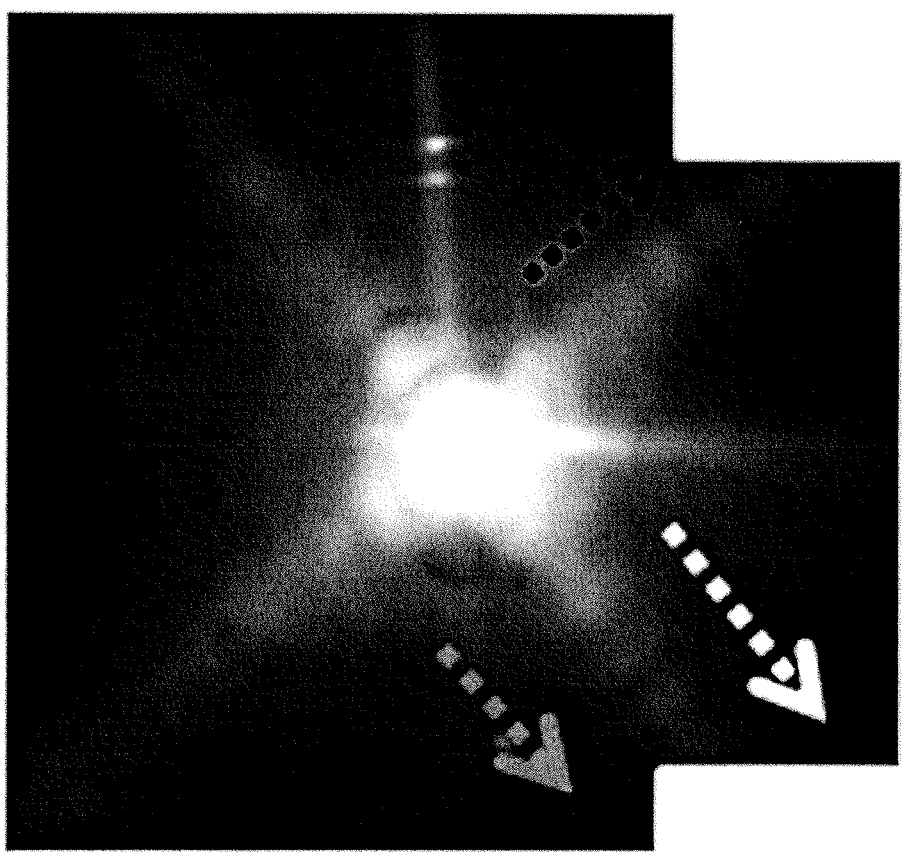
FIG. 10 illustrates an image observed when light of a surface light source is reflected on a display device according to a comparative example.

Hereinafter, images according to an exemplary embodiment and a comparative example will be described with reference to FIG. 9 and FIG. 10. FIG. 9 illustrates an image according to an exemplary embodiment, and FIG. 10 illustrates an image according to a comparative example.

Referring to the image shown in FIG. 9, it can be seen that the color separation phenomenon does not occur even when light of a surface light source is reflected on the display device according to the exemplary embodiment. In contrast, in the display device according to the comparative example, as shown in the photograph of FIG. 10, it can be seen that the image is blurry as green light or purple light (red light+blue light) is viewed by an external surface light source. Therefore, in the display device according to the exemplary embodiment, it can be confirmed that red light, green light, and blue light are separated and reflected by an external surface light source or a point light source such that the reflected color separation phenomenon viewed by the user's eyes is reduced.

By way of summation and review, embodiments provide a display device that includes a pixel electrode with a dummy region opposite a contact region, thereby reducing a reflected color separation phenomenon caused by an external surface light source or point light source in a state in which the display device is not driven.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
a substrate;
a thin film transistor on the substrate;
an interlayer insulating layer on the thin film transistor;
an electrode on the interlayer insulating layer, the electrode including:
an emission region,
a contact region overlapping the thin film transistor, and
a dummy region protruding from the emission region in a direction different from the contact region; and
an emission layer on the electrode, the emission region of the electrode overlapping the emission layer, wherein
the dummy region and the contact region are symmetrically disposed with respect to the emission region in a plan view, and
the interlayer insulating layer includes a groove overlapping the dummy region.

2. The display device as claimed in claim 1, wherein the interlayer insulating layer includes a first hole overlapping the contact region, the contact region, and the thin film transistor being connected through the first hole.

3. The display device as claimed in claim 2, wherein the interlayer insulating layer further includes:
a first interlayer insulating layer on the thin film transistor; and
a second interlayer insulating layer on the first interlayer insulating layer.

4. The display device as claimed in claim 3, wherein:
the first hole passes through the first interlayer insulating layer and the second interlayer insulating layer, and
the groove passes through the second interlayer insulating layer.

5. The display device as claimed in claim 3, wherein the dummy region contacts the first interlayer insulating layer through the groove.

6. The display device as claimed in claim 1, wherein thicknesses of the emission region, the contact region, and the dummy region are substantially the same.

7. The display device as claimed in claim 1, further comprising:
a pixel defining layer on the electrode,
wherein the emission layer includes:
a first emission layer to emit light having a first wavelength,
a second emission layer to emit light having a second wavelength, and
a third emission layer to emit light having a third wavelength;
wherein the pixel defining layer includes:
a first opening overlapping the first emission layer,
a second opening overlapping the second emission layer, and
a third opening overlapping the third emission layer; and
wherein the electrode includes:
a first electrode overlapping the first emission layer,
a second electrode overlapping the second emission layer, and
a third electrode overlapping the third emission layer.

8. The display device as claimed in claim 7, wherein:
the first electrode includes a first emission region, a first contact region, and a first dummy region,
the second electrode includes a second emission region, a second contact region, and a second dummy region, and
the third electrode includes a third emission region, a third contact region, and a third dummy region.

9. The display device as claimed in claim 8, wherein the first emission layer and the third emission layer, and the second emission layer, are positioned at different sides with respect to an imaginary line connecting the first contact region, the second contact region, and the third contact region that are adjacent to each other.

10. The display device as claimed in claim 8, wherein at least one of the first dummy region, the second dummy region, and the third dummy region, and the remainder thereof, are positioned at different sides with respect to an imaginary line connecting the first contact region, the second contact region, and the third contact region that are adjacent to each other.

11. The display device as claimed in claim 7, wherein:
the display device includes a plurality of second electrodes,
at least one of the plurality of second electrodes includes the contact region, the emission region, and the dummy region, and
a remainder of the plurality of second electrodes includes the contact region and the emission region.

12. The display device of claim 1, wherein the dummy region is spaced apart from the emission region.

13. The display device as claimed in claim 1, wherein the electrode includes a reflective region.

14. The display device as claimed in claim 13, wherein the contact region, the dummy region, and the reflective region are symmetrical with respect to the emission region.

15. The display device as claimed in claim 1, further comprising:
a common electrode on the emission layer;
a thin film encapsulation layer on the common electrode; and
at least one of a light blocking member and a color filter on the thin film encapsulation layer.

16. The display device as claimed in claim 1, wherein the dummy region is in a form of a protrusion protruding from the emission region in a direction different from the contact region as shown in plan view.

17. The display device as claimed in claim 16, wherein the contact region is in a form of a protrusion overlapping the thin film transistor and protruding from the emission region as shown in plan view.

18. A display device, comprising:
a substrate;
a thin film transistor on the substrate;
an interlayer insulating layer on the thin film transistor;
an electrode on the interlayer insulating layer, the electrode including:
an emission region,
a contact region overlapping the thin film transistor, and
a dummy region protruding from the emission region, the contact region and the dummy region being depressed from an upper surface of the interlayer insulating layer; and
an emission layer on the electrode, the emission region of the electrode overlapping the emission layer, wherein
the dummy region and the contact region are symmetrically disposed with respect to the emission region in a plan view.

19. The display device as claimed in claim 18, wherein the dummy region and the contact region protrude in different directions in a plan view with respect to the emission region.

20. The display device as claimed in claim 18, wherein a height of the depressed dummy region is equal to or smaller than that of the depressed contact region.

21. The display device as claimed in claim 18, wherein thicknesses of the emission region, the contact region, and the dummy region are substantially the same.

22. The display device as claimed in claim 18, wherein the dummy region is in a form of a protrusion protruding from the emission region in a direction different from the contact region as shown in plan view.

23. The display device as claimed in claim 22, wherein the contact region is in a form of a protrusion overlapping the thin film transistor and protruding from the emission region as shown in plan view.

* * * * *

UNITED STATES PATENT AND TRADEMARK OFFICE
CERTIFICATE OF CORRECTION

PATENT NO. : 10,868,092 B2
APPLICATION NO. : 16/215942
DATED : December 15, 2020
INVENTOR(S) : Sun-Kyu Joo et al.

It is certified that error appears in the above-identified patent and that said Letters Patent is hereby corrected as shown below:

On the Title Page

Please add:
(30) Foreign Application Priority Data
Mar. 9, 2018 (KR) ......................... 10-2018-0028279

Signed and Sealed this
Twenty-fifth Day of July, 2023

Katherine Kelly Vidal
*Director of the United States Patent and Trademark Office*